United States Patent
Harada et al.

(10) Patent No.: US 8,105,878 B2
(45) Date of Patent: Jan. 31, 2012

(54) MANUFACTURING METHOD OF A SEMICONDUCTOR DEVICE HAVING A PACKAGE DICING

(75) Inventors: Haruhiko Harada, Nanae (JP); Takao Matsuura, Nanae (JP)

(73) Assignee: Renesas Electronics Corporation, Kanagawa (JP)

( * ) Notice: Subject to any disclaimer, the term of this patent is extended or adjusted under 35 U.S.C. 154(b) by 943 days.

(21) Appl. No.: 11/833,606

(22) Filed: Aug. 3, 2007

(65) Prior Publication Data

US 2008/0076210 A1 Mar. 27, 2008

(30) Foreign Application Priority Data

Sep. 22, 2006 (JP) ................... 2006-257690

(51) Int. Cl.
*H01L 25/50* (2006.01)
*H01L 21/56* (2006.01)
*H01L 21/58* (2006.01)
*H01L 33/48* (2010.01)

(52) U.S. Cl. ........ 438/114; 438/107; 438/108; 438/112; 438/113; 438/118; 438/458; 438/464; 257/684; 257/724; 257/E23.001; 257/E23.003; 257/E23.116; 257/E21.499

(58) Field of Classification Search .............. 438/33, 438/68, 106–114, 458, 460–465, 118, 125–127; 257/678, 684, 723–724, E33.056–E33.06, 257/E23.001–E23.003, E23.116, E23.123–E23.125, 257/E23.134, E21.499

See application file for complete search history.

(56) References Cited

U.S. PATENT DOCUMENTS

| | | | | |
|---|---|---|---|---|
| 5,641,714 A * | 6/1997 | Yamanaka | | 438/14 |
| 7,105,424 B2 * | 9/2006 | Tsai et al. | | 438/464 |
| 7,408,259 B2 * | 8/2008 | Senoo et al. | | 257/701 |
| 7,641,760 B2 * | 1/2010 | Doi et al. | | 156/711 |
| 2002/0137309 A1 * | 9/2002 | Senoo et al. | | 438/460 |
| 2004/0159837 A1 * | 8/2004 | Inoue | | 257/59 |
| 2005/0023660 A1 * | 2/2005 | Saga | | 257/678 |
| 2005/0133895 A1 | 6/2005 | Ujiie et al. | | |
| 2005/0196900 A1 * | 9/2005 | Humphrey et al. | | 438/114 |
| 2005/0196939 A1 * | 9/2005 | Lee et al. | | 438/460 |
| 2005/0241754 A1 * | 11/2005 | Iri et al. | | 156/268 |
| 2006/0014320 A1 * | 1/2006 | Yamano et al. | | 438/113 |
| 2006/0124241 A1 * | 6/2006 | Doi et al. | | 156/344 |
| 2007/0025079 A1 * | 2/2007 | Salmon | | 361/688 |

FOREIGN PATENT DOCUMENTS

| | | |
|---|---|---|
| JP | 2001-196442 | 7/2001 |
| JP | 2005-183794 | 7/2005 |

* cited by examiner

*Primary Examiner* — Matthew Landau
*Assistant Examiner* — Maliheh Malek
(74) *Attorney, Agent, or Firm* — Mattingly & Malur, PC (57) ABSTRACT

A thermosetting tape is adopted as a dicing tape and, after package dicing, the thermosetting tape is heated, then a desired one of divided CSPs is picked up by an inverting collet. Since the thermosetting tape is heated o a predetermined temperature so that its adhesive force becomes zero, the CSP can be picked up by the inverting collet without peeling it off from the thermosetting tape. Thus, peel-off charging does not occur and therefore it is not necessary to perform a destaticizing process. As a result, it is possible to improve the production efficiency in assembling the semiconductor device (CSP).

4 Claims, 11 Drawing Sheets

MANUFACTURING METHOD OF A SEMICONDUCTOR DEVICE HAVING A PACKAGE DICING

CROSS-REFERENCE TO RELATED APPLICATIONS

The disclosure of Japanese Patent Application No. 2006-257690 filed on Sep. 22, 2006 including the specification, drawings and abstract is incorporated herein by reference in its entirety.

BACKGROUND OF THE INVENTION

The present invention relates to a semiconductor manufacturing technique and more particularly to a technique which can be effectively applied to a semiconductor device assembling method having a package dicing (dicing after resin molding) process.

In connection with a molding process involving sealing plural semiconductor chips at once with sealing resin, the semiconductor chips being mounted on a parts mounting surface of a matrix substrate, there is known a technique wherein a clamping pressure for clamping the matrix substrate by both lower and upper molds of a molding die is set at a relatively low pressure in the initial stage of injection of the molding resin and is switched to a relatively high clamping pressure when a semiconductor chip lying at the final stage in the resin injecting direction is coated with the molding resin (see, for example, Japanese patent laid-open No. 2005-183794).

Further, in connection with a pickup device, there is known a technique wherein positional information on pickup height of a workpiece is acquired on the basis of a state of contact between a workpiece and a chucking collet which is detected by contact state detecting means and the pickup operation of the work is controlled in accordance with the positional information (see, for example, Japanese patent laid-open No. 2001-196442).

SUMMARY OF THE INVENTION

In assembling a small-sized semiconductor device such as a CSP (Chip Size Package), semiconductor chips are mounted in plural device areas formed on a main surface of a matrix substrate and thereafter in a resin sealing process there is performed resin molding in a state in which the device areas are covered all together with a single cavity of a resin molding die (this resin molding method will hereinafter be referred to also as "block molding").

After the resin sealing, external terminals are formed by ball mounting, followed by dicing the individual CSPs (this process will hereinafter be referred to also as "package dicing").

In a package dicing process for CSPs, the resin body side of the package having been turned upside down to let the solder ball side face upward is affixed onto a dicing tape of a ring-like jig having the dicing tape, followed by dicing in this state into individual CSPs with a dicing blade. The dicing tape is usually a UV curing type tape having an adhesive layer adapted to cure upon radiation of UV (ultraviolet) thereto with consequent deterioration in the adhesive force of the dicing tape.

Subsequently, there is performed a pickup process wherein only a desired one of the CSPs thus acquired is lifted with a stick-up pin for example from the opposite side (the CSP-free side) of the dicing tape and is held by, for example, a chucking collet from the solder ball side of the CSP.

However, when peeling off the resin body of the CSP from the dicing tape by thrusting up the CSP in the pickup process after dicing (cutting), there occurs peel-off charging between the resin body and the dicing tape. That is, even if the adhesive force of the tape is deteriorated by UV (ultraviolet light) radiation to the dicing tape, there remains on the dicing tape an adhesive force to the extent that the individual CSPs do not scatter from the dicing tape, and in this state a desired CSP is thrust up from below by a stick-up pin, causing the resin body to be peeled off from the tape, so that there occurs peel-off charging. In this case, since the resin body is an insulating material, the amount of charging is larger than the amount of charging which occurs for example at the time of peeling off a semiconductor chip of silicon from the dicing tape. Against the peel-off charging, therefore, destaticizing is performed using an ionizer.

However, in case of destaticizing the peel-off charging with the use of an ionizer, if the ionizer is directed in only one direction (from one surface side), static electricity will lap on the side opposite to the ionizer side and it is difficult to effectively destaticize completely. To avoid this inconvenience, radiation is applied from plural surface sides, with the result that the time required for destaticizing becomes longer than the time required for the pickup work, thus giving rise to the problem of deteriorated production efficiency.

In Japanese patent laid-open No. 2005-183794, there is disclosed a CSP assembling process adopting a block molding method, while in Japanese patent laid-open No. 2001-196442, there is disclosed a pickup method using a stick-up pin for thrusting up a chip. Heretofore, also as to picking up a package after package dicing, such a pickup method using a stick-up pin as is disclosed in Japanese patent laid-open No. 2001-196442 has mainly been adopted. According to these methods, however, there occurs the foregoing peel-off charging, with consequent prolongation of the destaticizing time and deterioration of the semiconductor device production efficiency.

It is an object of the present invention to provide a technique capable of improving the production efficiency in assembling a semiconductor device.

It is another object of the present invention to provide a technique capable of improving the reliability of a semiconductor device.

The above and other objects and novel features of the present invention will become apparent from the following description and the accompanying drawings.

The following is an outline of a typical mode of the present invention as disclosed herein.

According to the present invention there is provided a semiconductor device manufacturing method comprising the steps of (a) cutting a matrix substrate with a plurality of semiconductor chips mounted thereover and a resin body formed thereover, in an affixed state of the matrix substrate onto a thermosetting tape, into individual semiconductor devices by a dicing blade, (b) after the step (a), heating the thermosetting tape to cure the tape, and (c) after the step (b), picking up a desired one of the semiconductor devices.

The following is a brief description of effects obtained by the typical mode of the present invention as disclosed herein.

A thermosetting tape is adopted as the dicing tape and is cured by heating after package dicing, then a semiconductor device obtained by dicing is picked up, whereby it becomes possible to pick up the semiconductor device without peeling off the semiconductor device from the thermosetting tape. Thus, peel-off charging does not occur and hence it is no longer required to go through the destaticizing process. As a result, it is possible to improve the production efficiency in assembling the semiconductor device.

Since peel-off charging does not occur in picking up the semiconductor device, it is possible to prevent charging of the semiconductor device and hence possible to improve the reliability of the semiconductor device.

Since a thermosetting tape is adopted as the dicing tape, it is possible to pick up the semiconductor device even without thrusting it up from below. As a result, it is possible to prevent chipping of the sealing body of the semiconductor device and hence possible to improve the reliability of the semiconductor device.

DETAILED DESCRIPTION OF THE PREFERRED EMBODIMENTS

In the following embodiments, as to the same or similar portions, repeated explanations thereof will be omitted in principle except where required.

Where required for convenience' sake, the following embodiments will each be described in a divided manner into plural sections or embodiments, but unless otherwise mentioned, they are not unrelated to each other, but are in a relation such that one is a modification or a detailed or supplementary explanation of part or the whole of the other.

In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to.

Embodiments of the present invention will be described in detail hereinunder with reference to the accompanying drawings. In all of the drawings for illustrating the embodiments, members having the same functions are identified by the same reference numerals, and repeated explanations thereof will be omitted.

Embodiments

Figure 1:
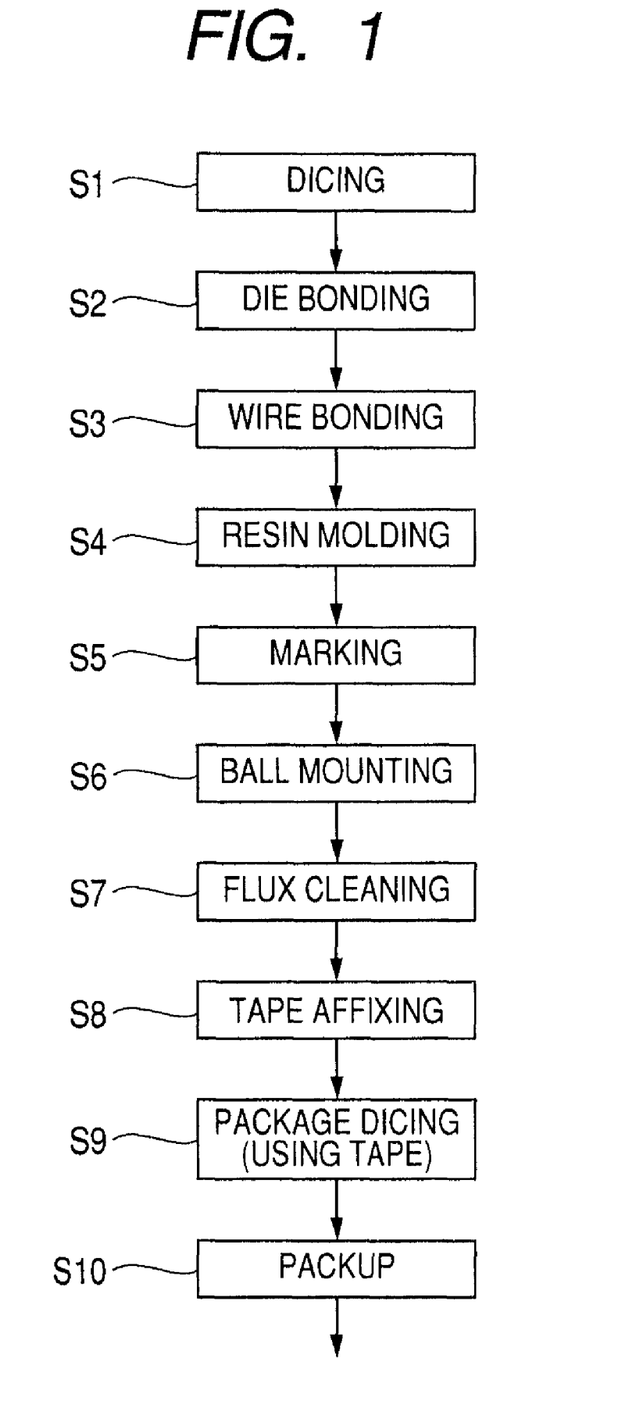
FIG. 1 is a process flow chart showing an example of a procedure for assembling a semiconductor device according to an embodiment of the present invention.
Figure 2:
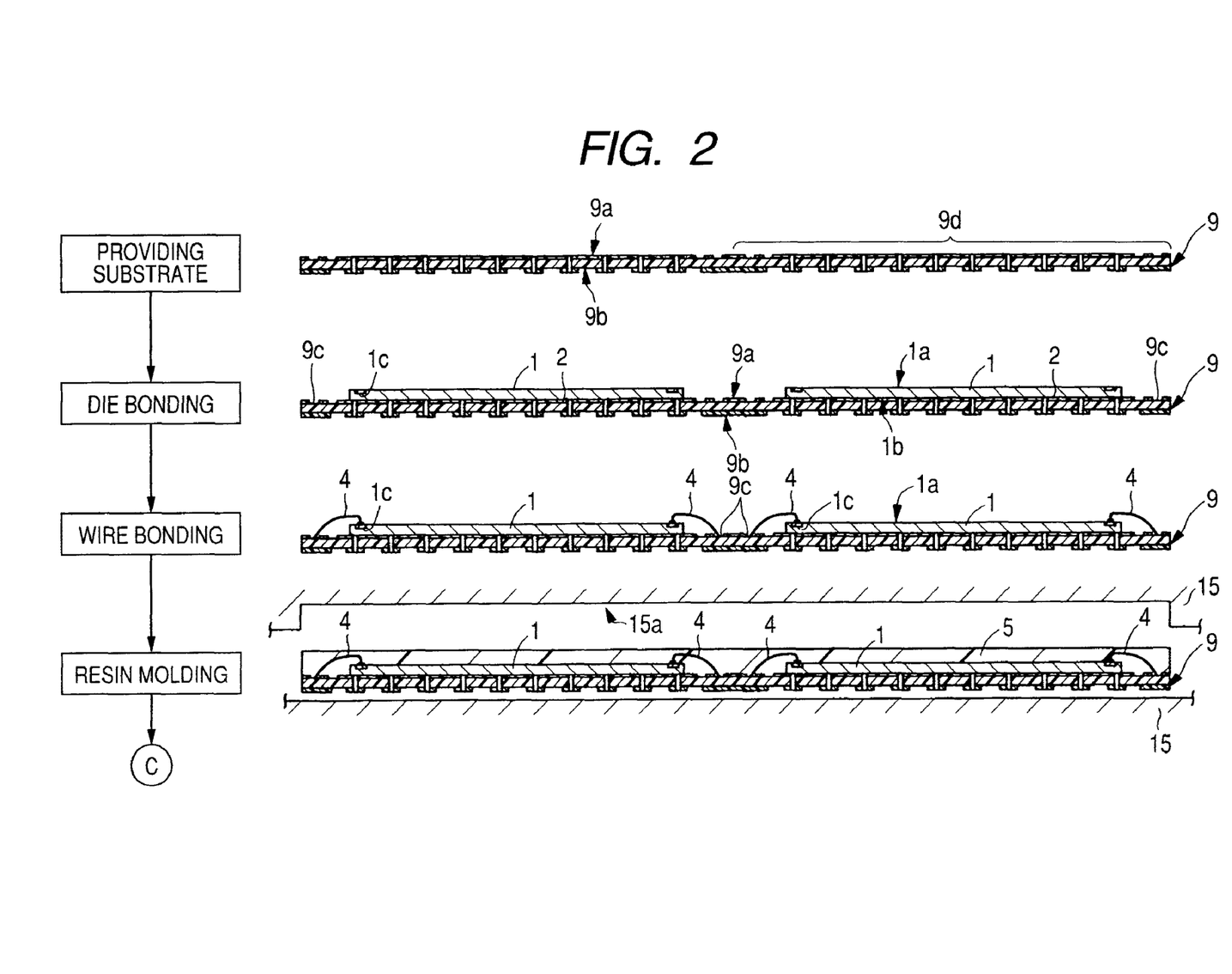
FIG. 2 is a manufacturing process flow chart showing an example of assembling steps up to resin molding in assembling the semiconductor device according to the embodiment.
Figure 3:
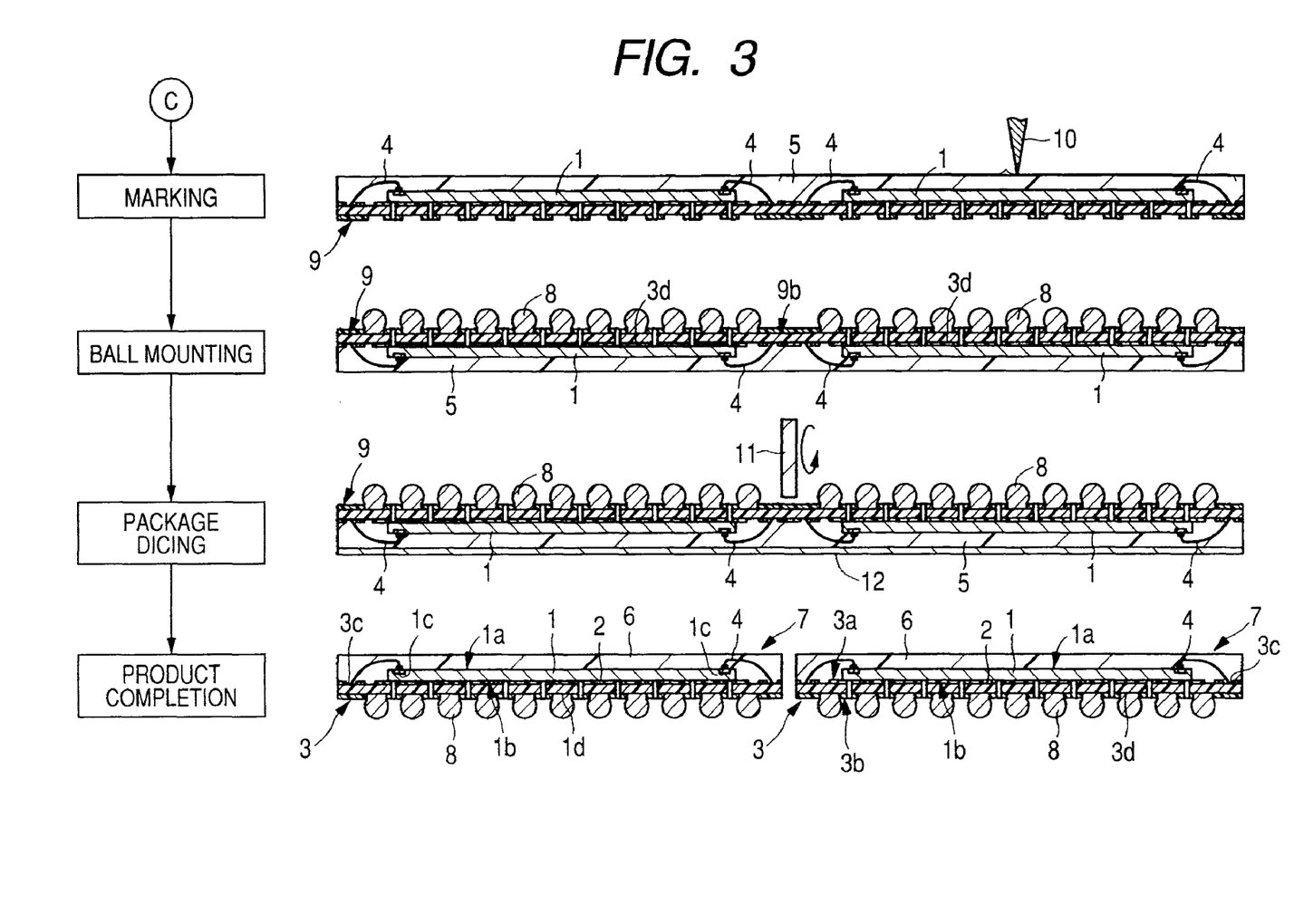
FIG. 3 is a manufacturing process flow chart showing an example of assembling steps after resin molding in assembling the semiconductor device according to the embodiment.
Figure 4:
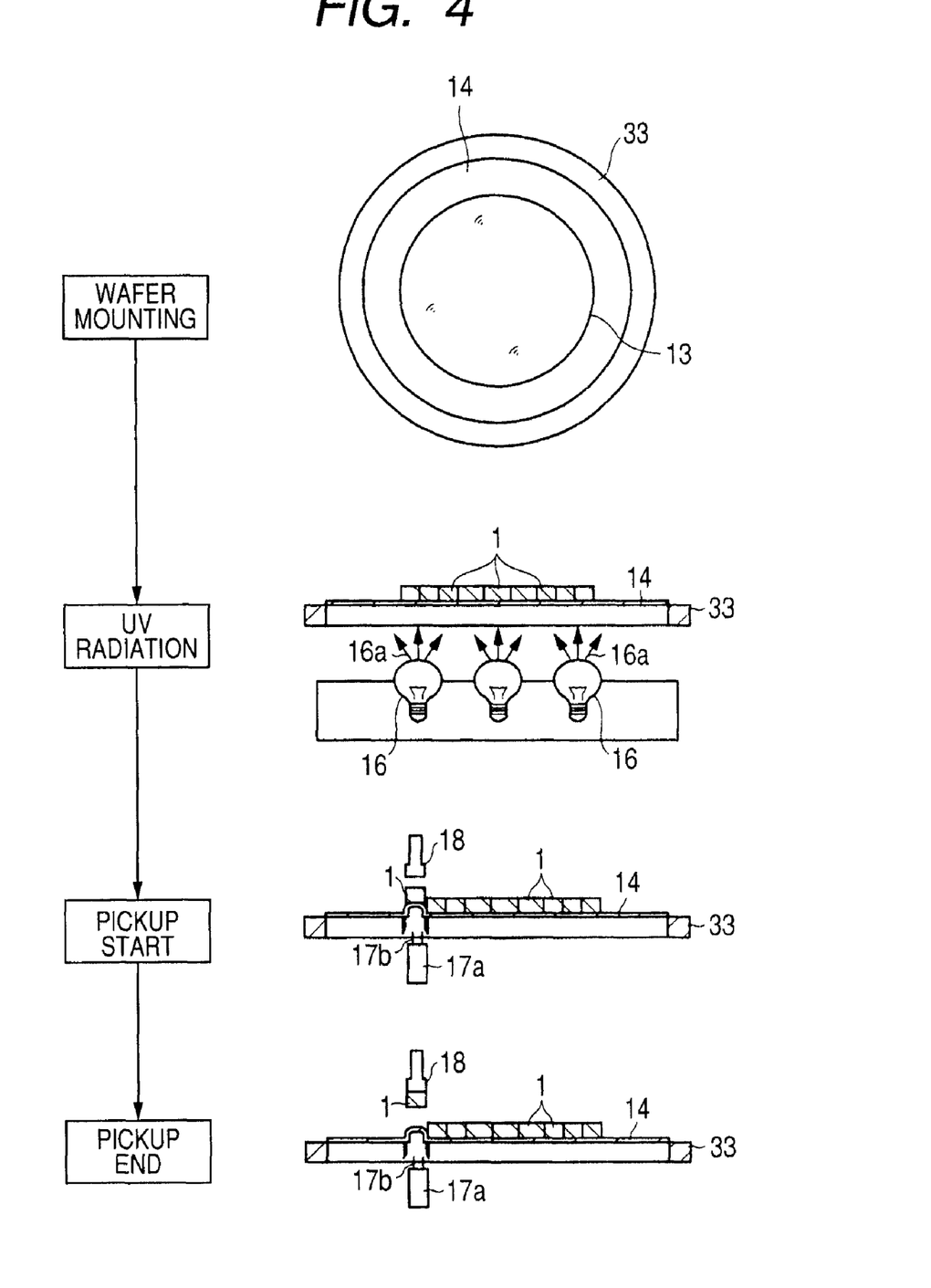
FIG. 4 is a process flow chart showing an example of detailed processings in a chip pickup process according to the embodiment.
Figure 5:
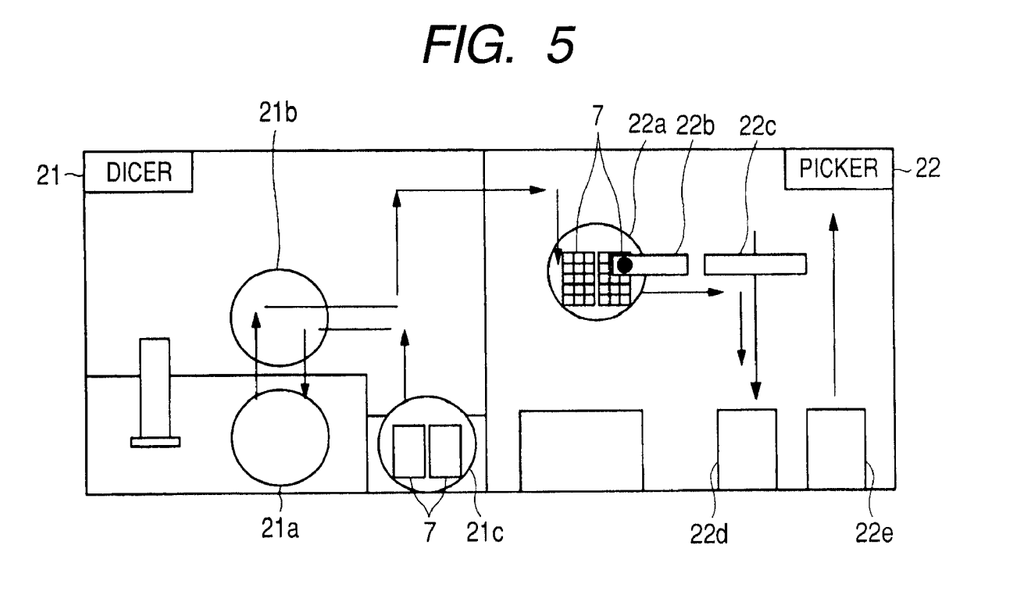
FIG. 5 is a plan view showing a structural example of a dicer and that of a picker both used in assembling the semiconductor device according to the embodiment.
Figure 6:
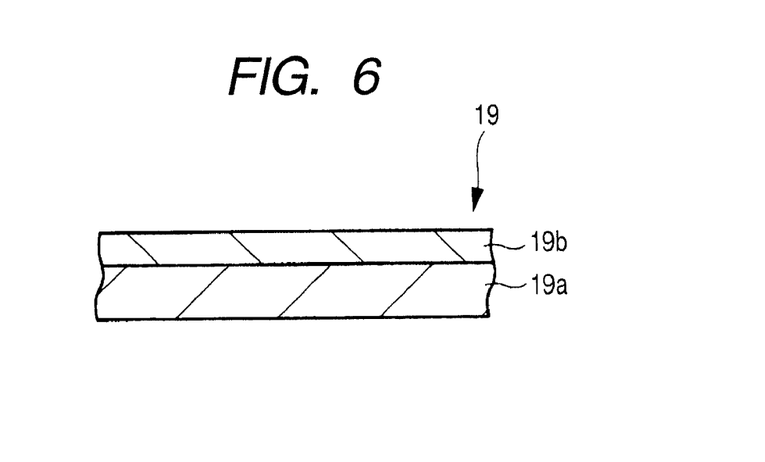
FIG. 6 is a partial, enlarged sectional view showing a structural example of a thermosetting tape used in a package dicing process in assembling the semiconductor device according to the embodiment.
Figure 7:
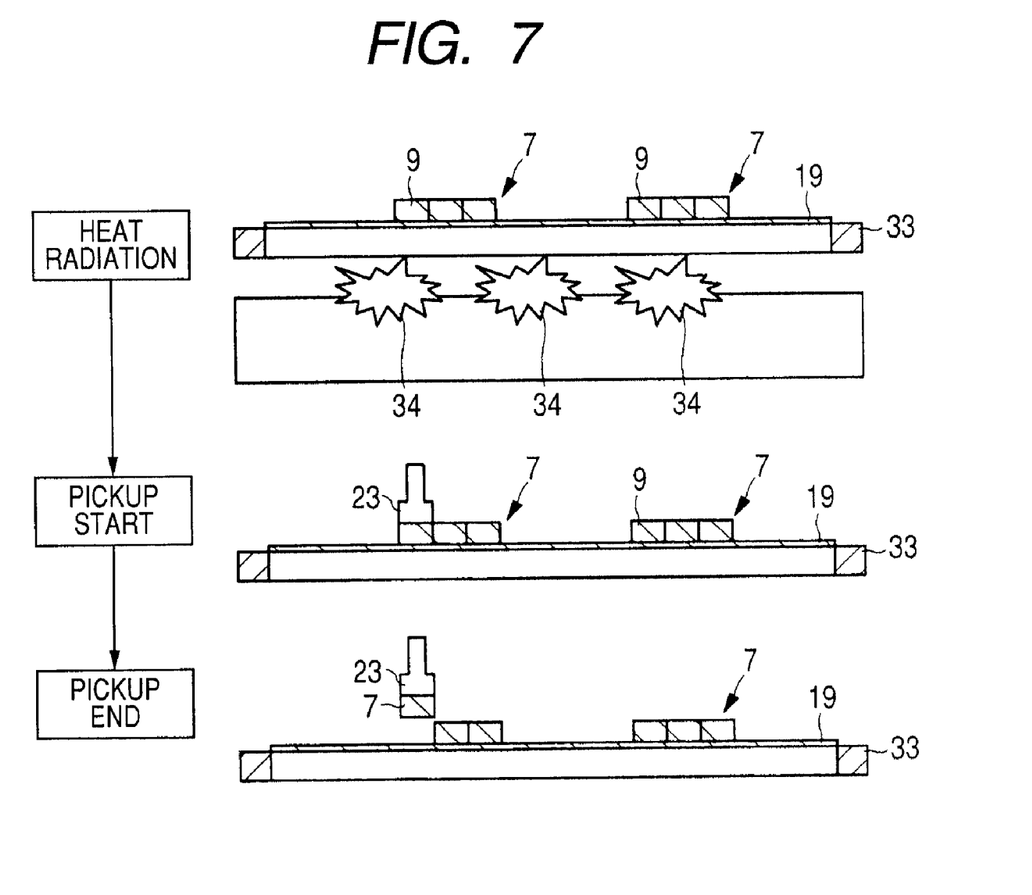
FIG. 7 is a process flow chart showing an example of an outline of a semiconductor device pickup method using the picker shown in FIG. 5.
Figure 8:
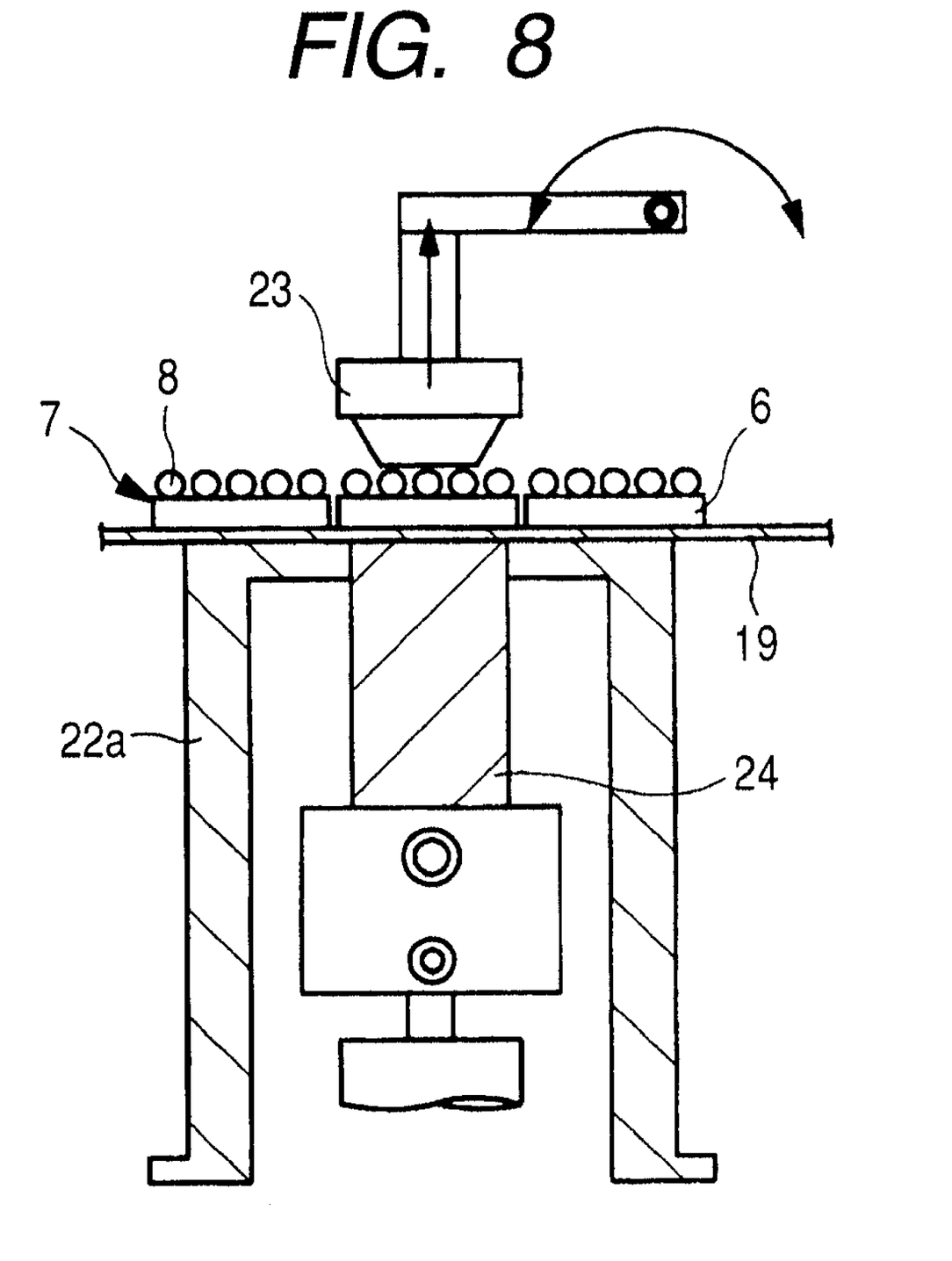
FIG. 8 is a sectional view showing an example of a state of spot heating in picking up the semiconductor device with use of the picker shown in FIG. 5.
Figure 9:
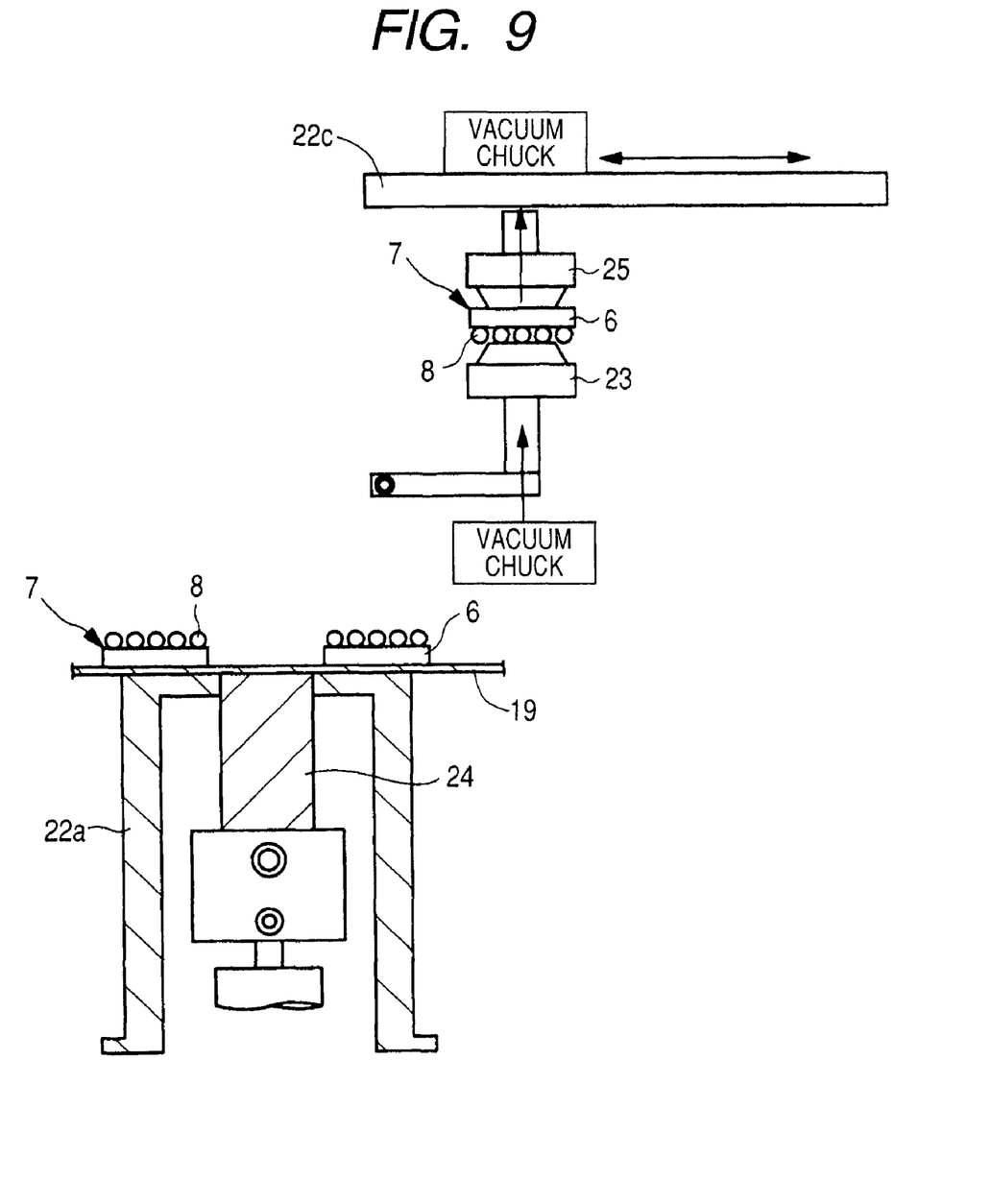
FIG. 9 is a sectional view showing an example of a pickup state after the spot heating shown in FIG. 8.
Figure 10:
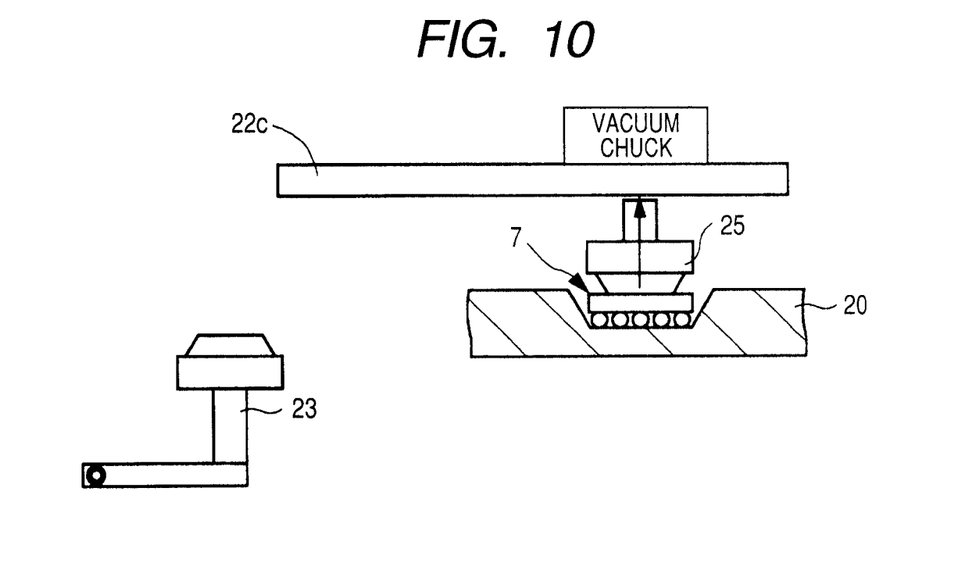
FIG. 10 is a sectional view showing an example of a state of conveyance after the chucking shown in FIG. 9.
Figure 11:
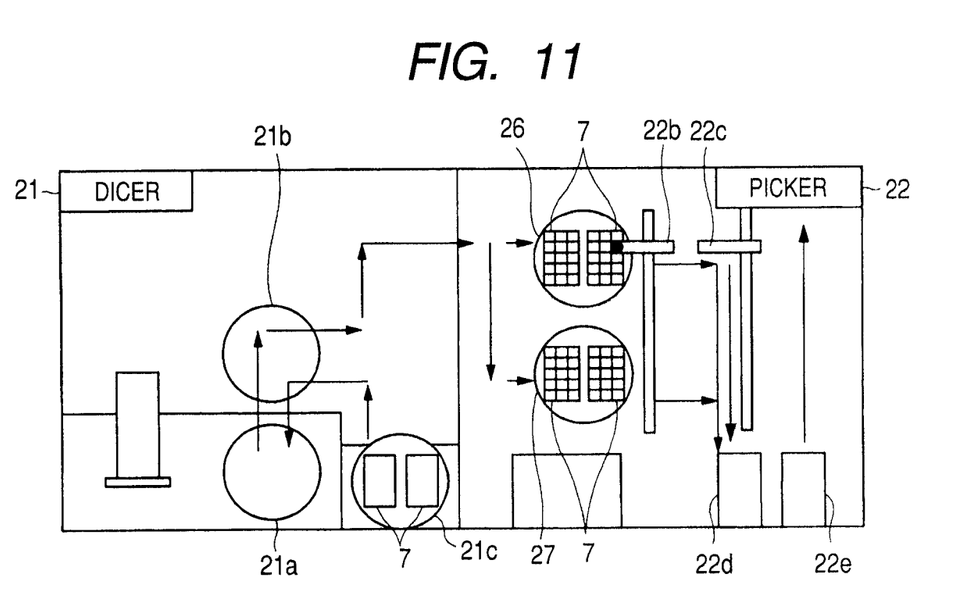
FIG. 11 is a plan view showing a structural example of a dicer and that of a picker both according to a modification of the embodiment.
Figure 12:
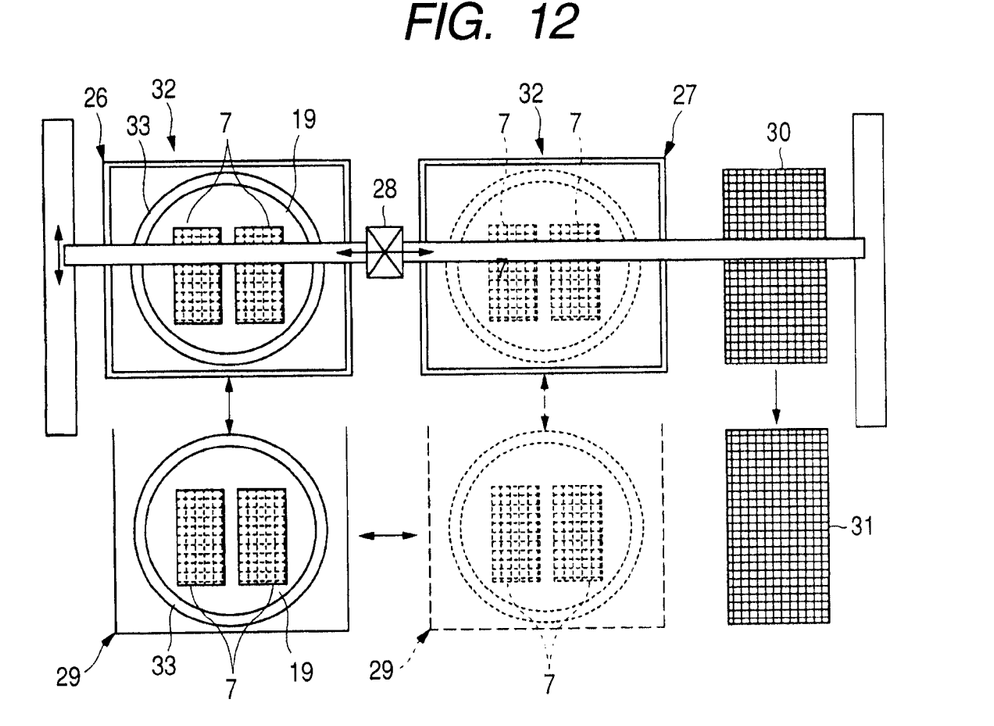
FIG. 12 is a plan view showing another structure of a pickup section in the picker shown in FIG. 11.
Figure 13:
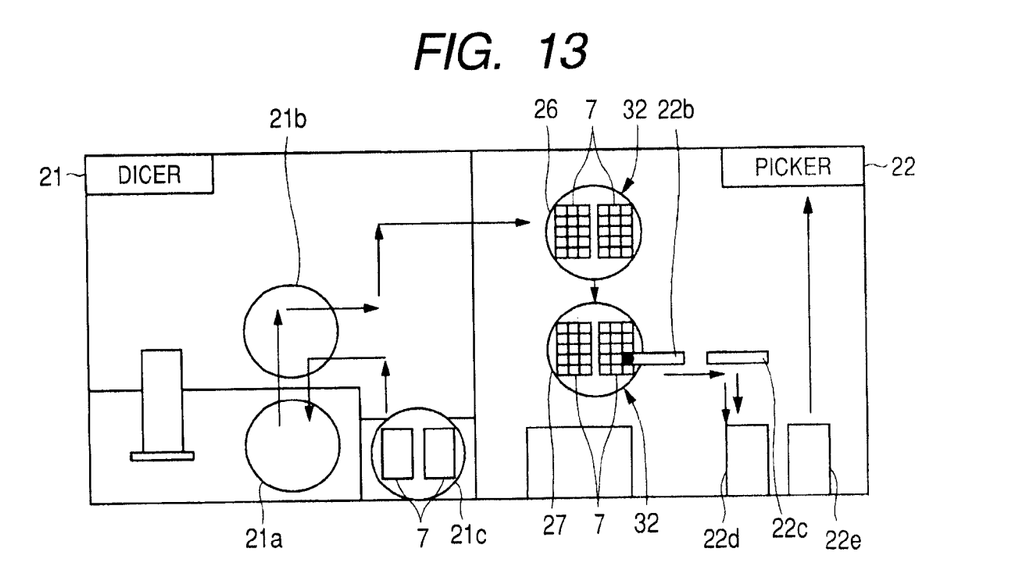
FIG. 13 is a plan view showing the structure of a dicer and that of a picker both according to another modification of the embodiment.
Figure 14:
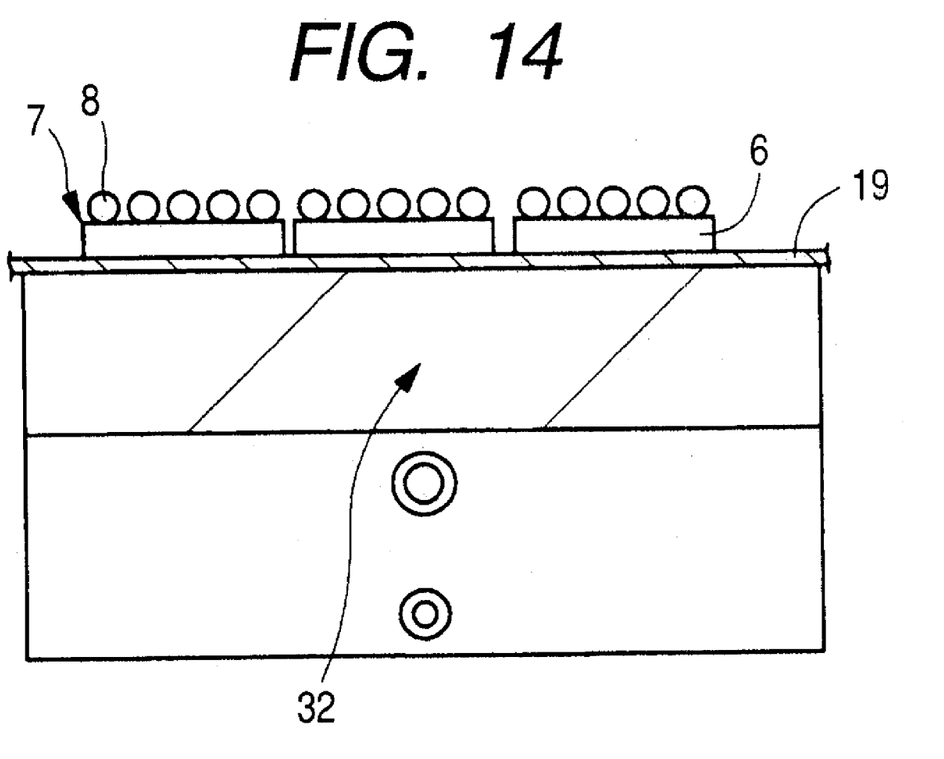
FIG. 14 is a sectional view showing an example of a state of preliminary heating in a preheating stage of the picker shown in FIG. 13.

FIG. 1 is a process flow chart showing an example of a procedure for assembling a semiconductor device according to an embodiment of the present invention, FIG. 2 is a manufacturing process flow chart showing an example of assembling steps up to resin molding in assembling the semiconductor device according to the embodiment, FIG. 3 is a manufacturing process flow chart showing an example of assembling steps after resin molding in assembling the semiconductor device according to the embodiment, FIG. 4 is a process flow chart showing an example of detailed processings in a chip pickup process according to the embodiment, FIG. 5 is a plan view showing a structural example of a dicer and that of a picker both used in assembling the semiconductor device according to the embodiment, FIG. 6 is a partial, enlarged sectional view showing a structural example of a thermosetting tape used in a package dicing process in assembling the semiconductor device according to the embodiment, FIG. 7 is a process flow chart showing an example of an outline of a semiconductor device pickup method using the picker shown in FIG. 5, FIG. 8 is a sectional view showing an example of a state of spot heating in picking up the semiconductor device with use of the picker shown in FIG. 5, FIG. 9 is a sectional view showing an example of a pickup state after the spot heating shown in FIG. 8, FIG. 10 is a sectional view showing an example of a state of conveyance after the chucking shown in FIG. 9, FIG. 11 is a plan view showing a structural example of a dicer and that of a picker both according to a modification of the embodiment, FIG. 12 is a plan view showing another structure of a pickup section in the picker shown in FIG. 11. Further, FIG. 13 is a plan view showing the structure of a dicer and that of a picker both according to another modification of the embodiment and FIG. 14 is a sectional view showing an example of a state of preliminary heating in a preheating stage of the picker shown in FIG. 13.

The semiconductor device of this embodiment is a small-sized, resin-sealed type semiconductor package having a semiconductor chip 1 mounted on a wiring substrate. In this embodiment, as an example of such a semiconductor package, reference is made to such a CSP 7 as shown in FIG. 3. In the CSP 7, plural solder balls 8 as external terminals are arranged in lattice shape on a back surface 3b of the wiring substrate. Thus, the CSP 7 is a BGA type semiconductor package.

A description will now be given about the structure of the CSP 7 shown in FIG. 3. The CSP 7 is made up of a package substrate 3 as a wiring substrate, a semiconductor chip 1 mounted on a main surface 3a of the package substrate 3 and having an integrated circuit, electrically conductive wires 4 for electric connection between pads 1c as surface electrodes of the semiconductor chip 1 and bonding terminals 3c of the package substrate 3, plural solder balls 8 as external terminals provided on plural lands 3d formed on the back surface 3b of the package substrate 3, and a resin body 6.

The semiconductor chip 1 is formed of silicon for example and an integrated circuit is formed on a main surface 1a of the semiconductor chip. A planar shape intersecting the thickness of the semiconductor chip 1 is quadrangular and it is square in this embodiment. In a peripheral edge portion of the chip main surface 1a there are formed plural pads 1c coupled electrically to the integrated circuit. The pads 1c and bonding terminals 3c arranged in a peripheral edge portion of the main surface 3a of the package substrate 3 are electrically coupled together through electrically conductive wires 4. For example, the wires 4 are gold wires.

A back surface 1b of the semiconductor chip 1 is fixed onto the package substrate 3 through an adhesive 2 such as, for example, paste or die attach film in a state in which its main surface 1a faces up.

The resin body 6 is formed of an epoxy resin for example and it is formed on the main surface 3a side of the package substrate 3 to seal the semiconductor chip 1 and plural conductive wires 4 with resin.

The solder balls 8 as external terminals provided on the back surface 3b of the package substrate 3 are formed, of, for example, solder such as Pb—Sn and are arranged in lattice shape on the substrate back surface 3b.

The package substrate 3 includes the main surface 3a, the back surface 3b opposite to the main surface 3a, the bonding terminals 3c formed in the peripheral edge portion of the main surface 3a, the lands 3d formed on the back surface 3b, and plural through hole wiring lines formed between the bonding terminals 3c and the lands 3d. The bonding terminals 3c formed in the peripheral edge portion of the main surface 3a are electrically coupled to the lands 3d on the back surface 3b through corresponding through hole wiring lines.

A planar shape intersecting the thickness of the package substrate is quadrangular and it is square in this embodiment.

Conductor patterns including the bonding terminals 3c and lands 3d of the package substrate 3 are formed of a copper alloy for example and plating applied to those conductor patterns is, for example, Ni/Au plating.

Next, a method of manufacturing the CSP 7 according to this embodiment will be described below with reference to the process flow charts of FIGS. 1, 2, 3 and 4.

First, in FIG. 1, dicing is performed to acquire semiconductor chips 1 as in step S1. In each of the semiconductor chips 1, plural pads 1c as surface electrodes are formed in a peripheral edge portion of a main surface 1a of the semiconductor chip.

In the chip dicing process, when picking up the chip during and after dicing, there is used a UV curing tape (first dicing tape) 14, as shown in FIG. 4. Upon radiation of ultraviolet light to the UV curing tape 14, an adhesive layer thereof cures and its adhesive force is deteriorated.

As shown in Wafer Mounting in FIG. 4, a semiconductor wafer 13 is affixed to the UV curing tape 14 fixed to a ring-like jig 33, followed by dicing for division into individual semiconductor chips 1.

Thereafter, as shown in UV Radiation in FIG. 4, ultraviolet light 16a is radiated from a UV lamp 16 to the UV curing tape 14, causing the adhesive layer of the tape to cure and deteriorating its adhesive force. Then, as shown in Pickup Start in FIG. 4, a chucking collet 18 is disposed above a desired one of the divided semiconductor chips 1 and at the same time a stick-up piece 17a is disposed under the desired semiconductor chip. Further, a stick-up pin 17b is raised from the interior of the stick-up piece 17a to thrust up the semiconductor chip 1 and the chip is chucked by the chucking collet 18, thereby peeling off the semiconductor chip 1 from the UV curing tape 14. Thereafter, as shown in Pickup End in FIG. 4, the semiconductor chip 1 is picked up upward while chucking the chip by the chucking collet 18, whereby the acquisition of the semiconductor chip 1 shown in FIG. 2 is completed.

When peeling off the semiconductor chip 1 from the UV curing tape 14, it is possible that there will occur peel-off charging. However, since the semiconductor chip 1 is formed of not an insulating material such as resin but a semiconductor such as silicon, the amount of peel-off charging is almost equal to zero. A more detailed description will now be given on this regard. In the case of the semiconductor chip 1, its back surface 1b is fixed to the UV curing tape 14. However, the back surface 1b of the semiconductor chip 1 is ground in the state of a wafer to a desired thickness by a grinding work and is then subjected to polishing in order to relax a stress induced by fine concaves and convexes formed on the back surface (ground surface). Thus, the back surface 1b of each divided semiconductor chip 1 is a mirror-like surface. On the other hand, in the case of the resin sealing body, the surface (cavity surface) of a molding die is subjected to stain finish, taking mold-releasability after molding with the molding die into account. Therefore, the surface of the resin sealing body obtained by resin molding is also a satin finish surface. That is, the adhesive force between the semiconductor chip 1 having the mirror-finished back surface 1b and the UV curing tape 14 is lower (weaker) than the adhesive force between the resin sealing body having a satin-finished surface and the UV curing tape 14. Consequently, in the case of the semiconductor chip 1, the amount of peel-off charging becomes almost zero and a problem causing any inconvenience does not occur, thus permitting omission of the destaticizing process.

Thus, in the pickup process, including dicing, for the semiconductor chip 1, it is advisable to use the UV curing tape 14 which is shorter in curing time and higher in processing time as compared with the thermosetting tape which is cured by the application of heat.

On the other hand, Providing Substrate shown in FIG. 2 is performed. In this case, there is provided a matrix substrate 9 having a main surface 9a and a back surface 9b opposed to the main surface 9a. Plural device areas 9d as device-forming areas which form package substrates 3a are arranged as partitioned areas on the main surface 9a.

Thereafter, step S2 in FIG. 1 and die bonding in FIG. 2 are preformed to fix the semiconductor chips 1 onto the device areas 9d of the matrix substrate 9 through an adhesive 2.

Subsequently, step S3 in FIG. 1 and wire bonding in FIG. 2 are performed. More specifically, pads 1c on the main surface 1a of the semiconductor chips 1 and corresponding electrodes 9c (bonding terminals 3c) on the matrix substrate 9 are coupled together electrically through electrically conductive wires 4 such as gold wires.

Thereafter, resin molding of step S4 is performed. More specifically, the device areas 9d on the matrix substrate 9 are covered all together with a single cavity 15a of a resin molding die 15 and sealed with resin. That is, the semiconductor chips 1 and the wires 4 are covered all together with a single cavity 15a of the resin molding die 15 and sealed with resin, thereby forming a block molding body 5. The sealing resin which forms the block molding body 5 is, for example, a thermosetting epoxy resin.

Then, marking of step S5 in FIG. 1 (marking in FIG. 3) is performed. More specifically, marking, indicated at 10, is performed for example by a laser marking method to put a mark on the block molding body 5. The marking may be done for example by an ink marking method.

Thereafter, Ball Mounting of step S6 (Ball Mounting in FIG. 3) is performed to couple solder balls 8 to lands 3d formed on the back surface 9b of the matrix substrate 9.

In this case, flux is applied to the lands 3d, followed by mounting balls thereon and subsequent heat treatment (about 200° C.), whereby the solder balls 8 are cured to complete the mounting of balls. As the mounting of balls proceeds, flux residue as residual flux is formed near the bonded portions of the solder balls 8.

Then, Flux Cleaning of step S7 is performed to remove the flux residue.

After completion of flux cleaning, Package Dicing in FIG. 3 is performed. More specifically, the matrix substrate 9 after flux cleaning is diced into individual semiconductor devices (CSPs 7). In this case, first, Affixing Tape of step S8 in FIG. 1 is performed. That is, a dicing tape 12 is affixed to the surface of the block molding body 5 formed by resin molding.

The dicing tape 12 used in package dicing in this embodiment is a thermosetting tape (second dicing tape) 19 shown in FIG. 6. For example, the thermosetting tape 19 has a two-layer structure comprising a base 19a such as a polyester base and a thermally releasable adhesive layer 19b, the base 19a and the adhesive layer 19b being stacked one on the other. A thermally releasing temperature of the thermally releasable adhesive layer 19b is, for example, 90° C. In this case, the adhesive layer 19b exhibits such a characteristic as cures on heating to 90° C. or higher, resulting in its adhesive force becoming zero. In the case of the UV curing tape 14, when ultraviolet light 16a is radiated thereto, the adhesive layer (adhesive) formed on the surface of the tape 14 cures and therefore its adhesive force is deteriorated. However, the state of the surface of the UV curing tape 14 scarcely exhibits any change even in comparison with that before curing. On the other hand, in the case of the thermosetting tape 19, when heat is applied thereto, the thermally releasable adhesive layer 19 formed on the surface of the tape 19 cures as is the case with the UV curing tape 14, so that its adhesive force is deteriorated. However, the surface of the thermosetting tape 19 assumes a dried state because heat is applied thereto. Thus, not only the adhesive layer (adhesive) cures, but also the surface thereof assumes a dried state, so that it is easy to deteriorate the adhesive force to zero in comparison with the UV curing tape 14.

Therefore, in the package dicing according to the present invention, there is used the thermosetting tape 19 as the dicing tape 12 in order to prevent the occurrence of peel-off charging at the time of picking up a CSP 7 from the thermosetting tape 19. More specifically, when picking up a CSP 7 in the pickup section after package dicing, the thermosetting tape 19 is heated in the pickup section so as to become 90° C. or higher in temperature, thereby making zero the adhesive force of the thermally releasable adhesive layer 19b of the thermosetting tape 19, and then the picking-up operation for the CSP 7 is performed. By so doing, it is possible to prevent the occurrence of peel-off charging during pickup.

Although the temperature for making zero the adhesive force of the thermosetting tape 19 is 90° C., if the temperature is raised too high, the bonding strength of the solder balls 8 will be deteriorated. Therefore, when characteristics (e.g., coupling strength of the solder balls 8) are taken into account, the application of a temperature exceeding 120° C. is not desirable. In view of these points, the temperature to be applied to the thermosetting tape 19 is preferably in the range of 90° C. to 120° C.

Heating of the thermosetting tape 19 is performed at the following timing. After package dicing (cutting) is performed in a dicer 21 shown in FIG. 5, the CSPs 7 are conveyed onto a pickup stage 22a as a pickup section in a picker 22, then after the conveyance is over, heating of the thermosetting tape 19 is conducted before picking up a CSP 7 on the pickup stage 22a (before rise of an inverting collet 23 shown in FIG. 9).

This is for the following reason. If heating of the thermosetting tape 19 is performed before the tape is conveyed to the pickup stage 22a, the adhesive force of the thermosetting tape 19 becomes zero, with the result that the diced CSPs 7 on the tape 19 are scattered (scattered from the dicing tape) and can no longer be conveyed to the pickup stage 22a. Thus, it is preferable that the heating of the thermosetting tape 19 be conducted at an appropriate timing after completion of the conveyance onto the pickup stage 22a and before the start of pickup (before the inverting collet 23 shown in FIG. 9 starts rising while chucking a CSP 7).

The following description is now provided about the configuration of the dicer 21 and that of the picker 22 both used in this embodiment and shown in FIG. 5.

The dicer 21 has a dicing stage 21a for dicing, a spinner 21b as a cleaning stage after dicing, and a loader section 21c. On the other hand, the picker 22, which is coupled to the dicer 21, has a pickup stage 22a as a pickup section, an inverting head 22b for picking up a product, a product conveying head 22c, a tray unloader 22d for the recovery of a product-accommodated tray, and a tray loader 22e for the delivery of empty trays.

In the package dicing process, first Affixing Tape of step S8 in FIG. 1 is performed. As showing in Package Dicing in FIG. 3, the dicing tape 12 (thermosetting tape 19) is affixed to the surface of the block molding body 5 formed by resin molding. More specifically, the block molding body 5 is affixed onto the thermosetting tape 19 fixed to the ring-like jig 33 shown in FIG. 7.

Thereafter, Package Dicing (using tape) of step S9 in FIG. 1 is performed.

The package dicing is carried out in the following manner. In the dicer 21 shown in FIG. 5, the ring-like jig 33 is delivered from the loader section 21c toward the dicing stage 21a in a state in which products are affixed onto the thermosetting tape 19, then on the dicing stage 21a, as shown in Package Dicing in FIG. 3, in a fixed state of CSPs 7 by the dicing tape 12 (thermosetting tape 19), the matrix substrate is diced into individual CSPs 7 by means of a dicing blade 11.

Thereafter, the thus-diced CSPs 7 as affixed to the ring-like jig 33 are conveyed together with the ring-like jig 33 onto the spinner 21b of the dicer 21. Then, high-speed cleaning is performed by the spinner 21b to wash off wastes resulting from dicing.

Subsequently, the diced CSPs 7 as affixed to the ring-like jig 33 are conveyed as they are together with the ring-like jig 33 onto the pickup stage 22a of the picker 22, then Pickup of step S10 in FIG. 1 is performed.

In the pickup process carried out by the picker 22, first, as shown in Heat Radiation in FIG. 7, the thermosetting tape 19 (at least the area corresponding to all the CSPs 7) is heated to 90° C. on the pickup stage 22a by means of a heating member 34 such as a heater, thereby causing the thermally releasable adhesive layer 19 to cure. At this time, for example as shown in FIG. 8, a spot heater (heating means) 24, which is disposed under one CSP 7 correspondingly, is brought into contact with the thermosetting tape 19 to heat the same tape. The spot heater 24 heats an area of the thermosetting tape 19 spotwise which area corresponds to only one CSP 7. By this heating, the adhesive force on the tape area of only one CSP 7 to be picked up can be made zero and the CSP 7 not to be picked up can be kept affixed to the thermosetting tape 19.

On the other hand, the inverting collet 23 for vacuum chucking is disposed above the to-be-picked-up CSP 7 in a lightly contacted state with solder balls 8.

Thereafter, the thermosetting tape 19 is heated to 90° C. and is cured thereby so that the adhesive force of the thermosetting tape 19 becomes zero.

In the case of the thermosetting tape 19, its adhesive force can be made zero by heating the tape to 90° C. and curing it thereby. But in the case of the UV curing tape 14 shown in FIG. 4 and used for picking up a chip, its adhesive force cannot be made zero although it can be deteriorated by radiating ultraviolet light 16a thereto.

More particularly, when starting the pickup process, the adhesive force of the thermosetting tape (second dicing tape) 19 is lower than that of the UV curing tape (first dicing tape) 14. That is, in picking up a CSP 7 (product) after package dicing, it is essential to adopt not the UV curing tape 14 but the thermosetting tape 19. This is essential also for preventing the occurrence of peel-off charging.

After making zero the adhesive force of the thermosetting tape 19, vacuum chucking of the CSP 7 to be chucked is started by the inverting collet 23, as shown in Pickup Start in FIG. 7. More specifically, as shown in FIG. 9, the solder balls 8 of the CSP 7 are chucked and picked up by the inverting collet 23, then the collet 23 is inverted to deliver the CSP to a conveyance collet 25. The surface of the resin body 6 of the CSP 7 faces up as a result of inversion of the inverting collet 23 and now can be vacuum-chucked and held by the conveyance collet 25.

In this way the pickup process is ended as in FIG. 7. Subsequently, as shown in FIG. 10, the conveyance collet 25 is moved over the product conveying head 22c to convey the picked-up CSP 7 up to a predetermined position, whereupon the vacuum chucking of the picked-up CSP 7 is stopped, thereby accommodating the CSP 7 to a tray 20.

Heating of the thermosetting tape 19 on the pickup stage 22a may be carried out by a method wherein such heating means as shown in FIG. 14 is provided in the pickup stage 22a itself, (e.g., a stage equipped with heating means, such as a stage heater 32), and the thermosetting tape 19 is heated beforehand by the heating means provided in the pickup stage 22a and is thereafter heated by the spot heater 24 or the like.

By thus first conducting preheating (first heating) with heating means provided in the pickup stage 22a and then conducting heating (second heating) with the spot heater 24 it is possible to shorten the heating time.

By thus completing the pickup process and the package dicing process, the assembly of CSP 7 is completed and the manufacturing process flow reaches Product Completion shown in FIG. 3.

In Ball Mounting of step S6 in FIG. 1, solder is applied to the lands 3d on the matrix substrate 9 and thereafter solder balls 8 are formed by reflow. Therefore, also in the ball mounting process there arises the problem that the matrix substrate 9 further warps as a result of reflow. In the marking process there is performed marking by a laser marking method for example, but in a warped state of the package substrate 3 it is difficult to radiate laser light perpendicularly to the surface of the block molding body 5, thus resulting in a marking defect such that a mark is not put on the surface of the block molding body 5.

As in this embodiment, by performing the ball mounting process after the marking process, in other words, by performing the marking process before reflow to form solder balls 8 which reflow is one of the causes of warping of the matrix substrate 9, it is possible to suppress a marking defect.

The process of putting a mark on the block molding body 5 may be done after the ball mounting process.

According to the semiconductor device manufacturing method of this embodiment, the thermosetting tape 19 is adopted as the dicing tape 12 and it is heated to a predetermined temperature after package dicing, then, a CSP 7 (product) resulting from package dicing is picked up by the inverting collet 23, whereby the CSP 7 can be picked upward without peeling it off from the thermosetting tape 19. That is, since the adhesive force of the thermosetting tape 19 becomes zero by heating it to a predetermined temperature (e.g., 90° C.), a CSP 7 (semiconductor device) can be picked upward by the inverting collet 23 without peeling if off from the thermosetting tape 19.

Thus, peel-off charging does not occur during the pickup process, so that it is not necessary to perform the destaticizing process. As a result, it is possible to improve the CSP 7 pickup efficiency and hence improve the production efficiency in assembling the CSP 7.

Moreover, since peel-off charging does not occur during pickup of the CSP 7, it is possible to prevent electric charging of the CSP 7 and hence possible to improve the reliability of the CSP 7.

Further, by adopting the thermosetting tape 19 as the dicing tape 12 and heating it to a predetermined temperature (e.g., 90° C.), it is possible to make zero the adhesive force of the thermosetting tape 19 and hence possible to pick up the CSP 7 by only chucking with the chucking collet 23 even without thrusting up the CSP 7 from below at the time of picking it up.

Consequently, it is possible to prevent chipping of the resin body 6 of the CSP 7 and improve the reliability of the CSP 7.

Next, modifications of this embodiment will be described. In each of modifications illustrated in FIGS. 11 to 14 there is shown a picker 22 provided with two pickup sections (stages). In the modification illustrated in FIG. 11 there is shown a picker 22 provided with a first pickup state (pickup section) 26 and a second pickup stage (pickup section) 27. With such two pickup stages, while picking up a CSP 7 on one stage, heating of the thermosetting tape 19 can be done on the other stage. Thus, both picking up a CSP 7 and heating of the thermosetting tape 19 can be done at a time, whereby it is possible to further improve the pickup efficiency.

As means for heating the thermosetting tape 19 there may be used such a spot heater 24 as shown in FIG. 8, or such a stage heater 32 as shown in FIG. 14 which can heat an area of the thermosetting tape 19 corresponding to plural CSPs 7, or a combination of both spot heater 24 and stage heater 32. In case of combining the spot heater 24 and the stage heater 32 with each other, by first conducting preliminary heating with the stage heater 32 and then conducting regular heating with the spot heater 24, it is possible to shorten the heating time and improve the efficiency of the time required in the pickup process.

According to the modification illustrated in FIG. 12 there is shown another structure of the pickup section. There is used a picker 22 having a first pickup stage 26 and a second pickup stage 27 each provided with heating means, a product loader 29 for the delivery of products, a pickup collet 28 for picking up a product from each stage, an empty tray loader 30 for the delivery of empty trays, and a product recovering unloader 31 for the recovery of trays 20 accommodating CSPs 7.

Thus, the picker 22 shown in FIG. 12 has two stages—the first pickup stage 26 and the second pickup stage 27—and these stages each possess the function of such a stage heater 32 as shown in FIG. 14 which is heating means capable of heating an area of the thermosetting tape 19 corresponding to plural CSPs 7.

According to this configuration, for example while picking up a product (CSP 7) on the first pickup stage 26, the products on the product loader 29 are supplied to the second pickup stage 27, in which the thermosetting tape 19 is heated to make its adhesive force zero. Further, after completion of the pickup operation on the first pickup stage 26, the pickup collet 28 is moved to the second pickup stage 27, in which there is performed pickup of a product.

Also in the modification illustrated in FIG. 12, since there are provided two pickup stages, while a CSP 7 is picked up on one stage, heating of the thermosetting tape 19 can be done on the other stage. By thus conducting both pickup of a CSP 7 and heating of the thermosetting tape 19 simultaneously it is possible to improve the efficiency of the pickup process.

According to the modification illustrated in FIG. 12, moreover, each stage is configured as such a stage heater 32 as shown in FIG. 14 and there also may be used such a spot heater 24 as shown in FIG. 8. By combining the stage heater 32 and the spot heater 24 with each other, as is the case with the picker 22 shown in FIG. 11, the heating time can be shortened and the efficiency of the time required in the pickup process can be improved by first conducting preliminary heating with the stage heater 32 and then conducting regular heating with the spot heater 24.

Next, according to the modification illustrated in FIG. 13 there is shown a picker 22 provided with both a first pickup stage (pickup section) 26 for preliminary heating and a second pickup stage (pickup section) 27 for regular heating. As shown in FIG. 14, the first pickup stage for preliminary heating possesses the function of the stage heater 32 which can heat an area of the thermosetting tape 19 corresponding to plural CSPs 7.

According to this modification, first on the first pickup stage 26 there is performed a first heating step wherein the area of the thermosetting tape 19 corresponding to plural CSPs 7 arranged on the same stage is heated to a predetermined temperature (e.g., about 50-60° C.). Thereafter, the products (CSPs 7) are conveyed to the second pickup stage 27 and a CSP 7 is picked up on the second pickup stage 27. At this time there is performed a second heating step wherein only the area of the thermosetting tape 19 corresponding to this CSP 7 is heated by for example such a spot heater 24 as shown in FIG. 8, the spot heater 24 being disposed under one CSP 7 correspondingly. In the second heating step the thermosetting tape 19 is heated to the temperature of 90° C.

In this way it is possible to make zero the adhesive force of the area of the thermosetting tape 19 corresponding to only the CSP 7 to be picked up.

Further, the first heating (preliminary heating) of the thermosetting tape 19 can be done on the first pickup stage 26 while performing the pickup process on the second pickup stage 27, whereby it is possible to shorten the heating time and improve the efficiency of the pickup process.

Also in the second pickup stage 27 there may be used such a stage heater 32 as shown in FIG. 14. By first conducting preliminary heating with the stage heater 32 of the first pickup stage 26 and thereafter conducting regular heating with the stage heater 32 of the second pickup stage 27 it is possible to shorten the heating time and improve the efficiency of the time required in the pickup process.

Although the present invention has been described above concretely on the basis of embodiments thereof, it goes without saying that the present invention is not limited to the above embodiments, but that various changes may be made within the scope not departing from the gist of the invention.

For example, although in the above embodiments reference has been made as an example to the case where the thermally releasing temperature of the thermosetting tape 19 is 90° C., the thermally releasing temperature is not limited to 90° C., but may be above or below 90° C.

The present invention is suitable for an electronic device assembling method having both dicing and pickup processes.

What is claimed is:

1. A method of manufacturing a semiconductor device, comprising the steps of:
   (a) providing a matrix substrate having a main surface, a back surface opposed to the main surface, and a plurality of device-forming areas formed on the main surface;
   (b) mounting a plurality of semiconductor chips over the device-forming areas of the matrix substrate, respectively;
   (c) sealing the semiconductor chips with resin, and forming a resin body on the main surface of the matrix substrate;
   (d) attaching a surface of the resin body to an adhesive layer of a thermosetting tape;
   (e) after the step (d), cutting the matrix substrate into a plurality of semiconductor devices;
   (f) after the step (e), hardening the thermosetting tape by heating; and
   (g) after the step (f), picking up one of the semiconductor devices from the thermosetting tape,
   wherein the adhesive layer is comprised of a thermal curing type adhesive.

2. A method according to claim 1, wherein in the step (g) the semiconductor device is picked up by using a collet.

3. A method according to claim 1,
   wherein, after the step (f), the thermosetting tape affixed to a jig and with the individual semiconductor devices affixed thereto is conveyed together with the jig to a pickup section for performing the pickup, and
   wherein, in the step (g), the dicing tape is heated in the pickup section.

4. A method according to claim 1, wherein an adhesive force of the thermosetting tape after the step (f) is smaller than that of the thermosetting tape before the step (f).

* * * * *